(12) United States Patent
Lam et al.

(10) Patent No.: US 7,864,183 B1
(45) Date of Patent: Jan. 4, 2011

(54) DYNAMIC SWITCHING OF MEMORY TERMINATION CHARACTERISTICS IN A GRAPHICS SYSTEM

(75) Inventors: Bruce Lam, San Jose, CA (US); Luc Bisson, San Jose, CA (US); Gabriele Gorla, Santa Clara, CA (US); Tom Dewey, Menlo Park, CA (US); Andrew Bell, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 834 days.

(21) Appl. No.: 11/683,957

(22) Filed: Mar. 8, 2007

(51) Int. Cl.
*G06F 13/14* (2006.01)
*H03K 17/16* (2006.01)
*G11C 7/00* (2006.01)

(52) U.S. Cl. ............... 345/520; 345/213; 345/426; 345/519; 365/191; 365/203; 326/30

(58) Field of Classification Search ............... 326/30; 365/191, 203; 345/519, 520, 503, 502, 418, 345/213, 522, 534, 426, 530
See application file for complete search history.

(56) References Cited

U.S. PATENT DOCUMENTS

| | | | |
|---|---|---|---|
| 6,891,538 B1 * | 5/2005 | Tannenbaum | 345/426 |
| 7,075,543 B2 * | 7/2006 | Lim | 345/519 |
| 7,102,381 B2 * | 9/2006 | Chen et al. | 326/30 |
| 7,254,066 B2 * | 8/2007 | Lee | 365/191 |
| 7,382,366 B1 * | 6/2008 | Klock et al. | 345/213 |
| 7,579,861 B2 * | 8/2009 | Shin et al. | 326/26 |
| 7,663,633 B1 * | 2/2010 | Diamond et al. | 345/503 |
| 2003/0048276 A1 * | 3/2003 | Wasserman et al. | 345/581 |
| 2005/0285865 A1 * | 12/2005 | Diamond | 345/520 |

OTHER PUBLICATIONS

Designline, "The future of memory: graphics DDR3 SDRAM functionality." Designline, vol. 11, Issue 4 (8 pp) (4th Q. 2002).
Designline, "Graphics DDR3 on-die termination and thermal considerations." Designline, vol. 12, Issue 1 (8 pp) (1st Q. 2003).
Johnson, "Enabling signal conditioning circuitry, faster memory calls in graphics chips fuel higher performance." Chip Design Magazine (5 pp) (Dec.-Jan. 2004).
Johnson, "Enabling signal conditioning circuitry," Chip Design Magazine (7 pp) (Dec.-Jan. 2004).

* cited by examiner

*Primary Examiner*—Vibol Tan
(74) *Attorney, Agent, or Firm*—Cooley LLP

(57) ABSTRACT

A graphics system includes a graphics memory. The graphics system includes a high performance mode and at least one power savings mode. A termination impedance and switching threshold of the graphics memory are selected based on an operating mode of the graphics system.

20 Claims, 4 Drawing Sheets

US 7,864,183 B1

DYNAMIC SWITCHING OF MEMORY TERMINATION CHARACTERISTICS IN A GRAPHICS SYSTEM

FIELD OF THE INVENTION

The present invention is generally related to high speed memory technologies having on-die termination of transmission lines.

BACKGROUND OF THE INVENTION

There is increasing interest in using high bandwidth Dynamic Random Access Memory (DRAM) technology in graphics systems. The Graphics Double Data Rate 3 (GDDR3) specification is a DRAM memory specification that utilizes on-die termination to improve signal quality and thereby also permit higher memory clock rates. GDDR3 is described in the articles by Chris Johnson, "The Future of Memory: Graphics DDR3 SDRAM Functionality," Designline, Vol. 11, issue 4, 4Q02 and "Graphics DDR3 On-Die Termination and Thermal Considerations," Designline Vol. 12, issue 1, 1Q03/2Q03, the contents of each of which are hereby incorporated by reference. The on-die termination may be implemented using a push-pull driver circuit to set a termination resistance at the end of a transmission line using a pull-up resistor to a high voltage VDDQ. This permits, for example, a GDDR3 memory to operate at higher memory clock data rates than previous generation technologies, such as DDR. However, the on-die termination of GDDR3 has an associated DC current path from the termination to ground such that on-die termination results in increased on-die DC current and power dissipation compared with slower-speed technologies such as DDR. As a result, while GDDR3 offers improved signal quality and higher speeds, the cost of the using the on-die termination is that there is increased on-chip power dissipation associated with the on-die termination. Additionally, the use of higher clock rates in a graphics system also increases power consumption and heat dissipation.

The improved signal quality and memory clock rates of GDDR3 are beneficial for graphics systems implemented as set-top boxes. However, a problem arises in applications, such as notebook computers, where there is a power budget or a thermal budget. In such applications, utilizing a conventional GDDR3 memory may be undesirable.

Therefore, in light of the above described problems the apparatus, system, and method of the present invention was developed.

SUMMARY OF THE INVENTION

A graphics system has adjustable on-die memory termination. The termination impedance and the switching threshold of a driver are selected based on an operating mode of a system. In one implementation, the driver is terminated with a first switching threshold for a high performance mode having a first clock rate. In a power savings mode the clock rate is set at a second clock rate that is lower than the first clock rate. Additional power savings are achieved in the power savings mode by operating the driver un-terminated to reduce DC leakage current. The switching threshold in the power savings mode is reset to a value appropriate for operating un-terminated at the reduced second clock rate to detect valid data.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
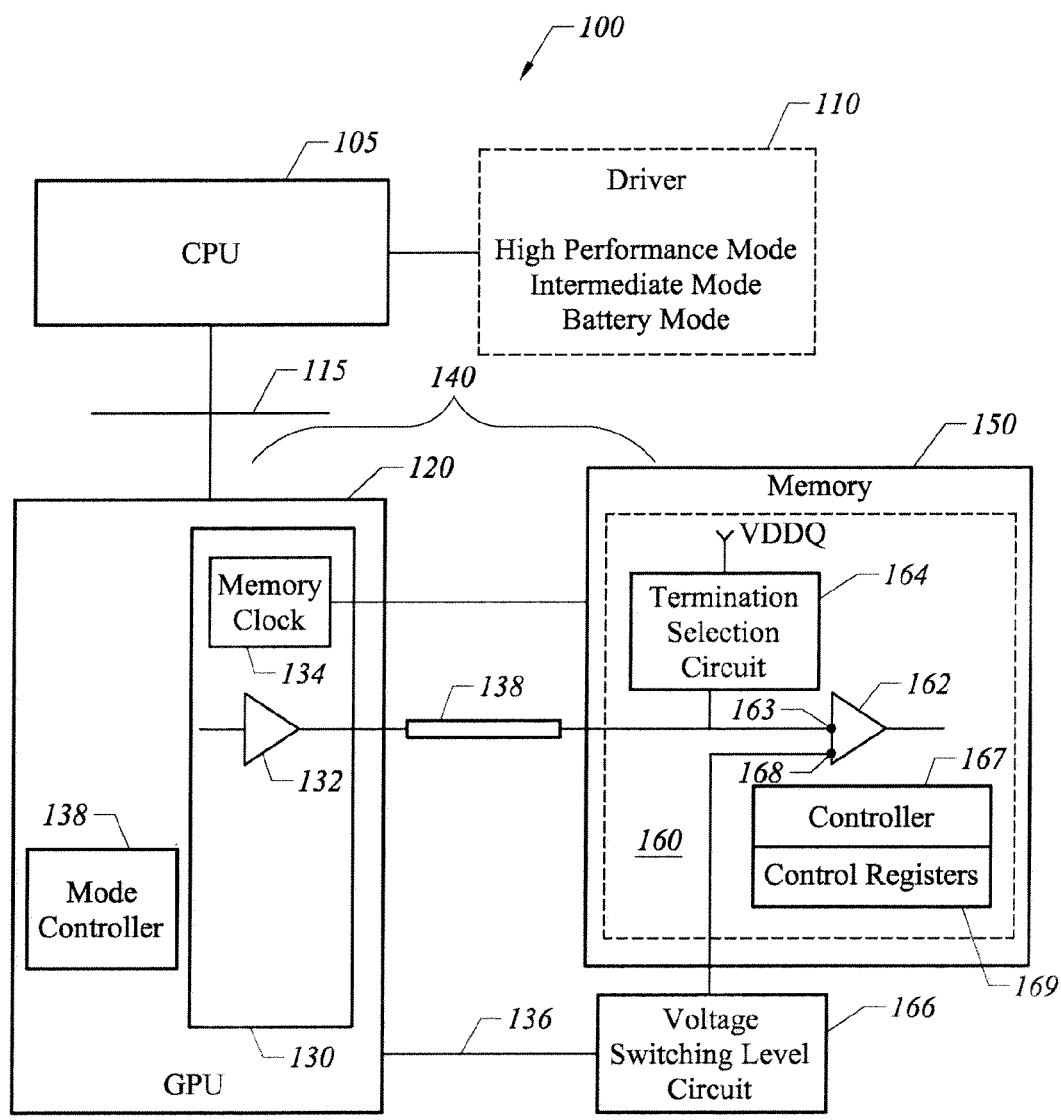
FIG. 1 illustrates a graphics system having dynamic memory termination switching in accordance with one embodiment of the present invention.

FIG. 1 is a block diagram illustrating one embodiment of the present invention. A graphics system 100 includes a central processing unit (CPU) 105. Graphics system 100 has a high performance mode and at least one power savings mode. As one example, graphics system 100 may have a power savings mode that is implemented when graphics system 100 operates off of battery power. In one implementation, CPU 105 has an associated graphics driver software program 110 (which may be stored on a memory accessible by CPU 105) that supports a conventional high performance mode and at least one power savings mode, such as a battery mode (with substantial power savings but comparatively low performance) and an intermediate performance mode (with performance and powers savings intermediate between the high performance mode and the battery mode).

CPU 105 is coupled to a graphics processing unit (GPU) 120 via an interface 115, such as a front-side bus, PCI Express, or other interface suitable to couple a CPU to a GPU. GPU 120 includes a first memory bus interface 130. The first memory bus interface 130 in GPU 120 includes a driver 132 to generate data signals to be transmitted to memory 150. Additionally, first memory interface 130 include a memory clock 134, such as a phase locked loop. The memory clock 134 has a selectable clock rate. In one implementation, memory clock 134 has at least two different selectable clock settings. The highest memory clock rate is used for the high performance mode. A lower memory clock rate is used for a power savings mode. Additionally, first memory interface 130 includes conventional components (not shown) to send and receive signals with memory 150.

GPU 120 is coupled to memory 150 by a memory bus 140 including first memory interface in GPU 120 and a second memory interface 160 in memory 150. In high speed memory architectures, data signals are sent from GPU 120 to memory 150 through memory bus 140 via one or more transmission lines 138, where an individual transmission line 138 may be implemented using a high speed trace. Transmission line 138 will have an associated impedance (e.g., 60 ohms). Signal quality is degraded unless transmission line 138 is terminated.

Memory 150 is a graphics memory, such as a Dynamic Random Access Memory (DRAM) frame buffer memory. Second memory interface 160 includes an on-die driver 162 having a data input node 163 coupled to transmission line 138. Driver 162 may, for example, correspond to an op amp. An on-die termination selection circuit 164 provides a selectable termination impedance at the data input node 163. In one implementation. there are two choices of termination impedance corresponding to a terminated mode and an un-terminated mode. The terminated mode may, for example, correspond to an impedance-matched termination in which data input node 163 is coupled via a pull-up resistor to a voltage source. The un-terminated mode may, for example, correspond to termination selection circuit being an open circuit (e.g., extremely high resistance approximating an open circuit). The terminated mode will thus have improved signal quality (due to an impedance matched condition in which deleterious signal reflections are reduced). However, the terminated mode will also have an increased power consumption due to an increased DC current.

A controller 167 is also located on-die and controls the operation of termination selection circuit 164. In one implementation controller 167 reads control registers 169. In one implementation. GPU 120 writes input commands to control register 169 to indicate the current operating mode. For example, with two modes, a single bit may be written in a control register 169 to indicate whether the system is operating in the terminated or un-terminated mode. Controller 167 thus supports dynamically changing the termination impedance whenever graphics system 100 changes its operating state to one with a different memory clock rate.

Driver 162 includes a voltage reference node 168 to receive a reference voltage that determines the switching threshold of driver 162. A voltage switching level circuit 166 is coupled to voltage reference node 168 of driver 162. Voltage switching level circuit 166 may, for example, be located off die and provide a reference voltage to a in (not shown) of memory 150. Voltage switching level circuit 166 is controlled by a signal from graphics processing unit 120. In one implementation, a graphics processor general purpose input/output (GPIO) signal is sent from GPU 120 to voltage switching level circuit 166 to select the switching threshold.

In one implementation, GPU 120 includes a mode controller 138 to coordinate adjustments of the memory clock rate, generation of input commands to memory 150 to change the termination impedance, and to control the switching threshold set by voltage switching level circuit 166. As described below in more detail, mode controller 138 may also implement a sequence of steps to transition between different memory clock rates for the current operating mode. Depending upon implementation details, mode controller 138 may act in response to commands from software driver 110 or other entities within graphics system that determine the operating mode (e.g., high performance mode, intermediate mode, or battery mode). Mode controller 138 is illustrated as residing in the GPU although it will be understood that a portion of the functionality of mode controller 138 may also reside in software executed by CPU 105, such as software driver 110.

The switching threshold of driver 162 for different selections of memory clock rates and termination impedances can be determined by performing simulations or empirical investigations. These criteria may also be analyzed using eye diagrams and/or timing diagrams. The switching threshold must be selected such that data is held valid for a sufficient minimum period of time with respect to the clock edges. That is, the switching threshold must be set appropriately for the memory clock rate and the termination impedance in order to satisfy criteria for reliably detecting valid data for a particular clock cycle. In particular, the switching threshold used in high memory rate GDDR3 memories at typical GDDR3 memory clock rates for the terminated mode is not appropriate for reliably detecting data for many ranges of lower memory clock rates with the driver un-terminated. That is, the switching threshold needs to be changed when operating in the un-terminated mode for a range of clock rates that is lower than conventional GDDR3 memory clock rates in which the driver is terminated. As an illustrative example, suppose a first mode of operation has a comparatively high memory clock rate and requires that the driver be terminated in order to support the high memory clock rate (e.g., conventional GDDR3 memory clock rates). In designing a power savings mode, an analysis would be performed to determine a lower range of memory clock rates for which the driver is capable of operating un-terminated with the switching threshold appropriately reset. Thus, in addition to the power savings provided by using the lower range of memory clock rates additional power savings occur due to the reduced DC leakage current of the un-terminated mode.

As an illustrative example, in a high performance mode, graphics system 100 may select a high memory clock rate with the memory 150 operating in the terminated mode. However, in a power savings mode graphics system 100 may select a lower memory clock rate with the memory 150 operating in the un-terminated mode. Thus, it will be understood that graphics system 100 operates in a terminated mode when required to support a high memory clock rate but is also capable of operating in a lower power consumption un-terminated mode when the clock rate is reduced to a rate compatible with the un-terminated mode. As an illustrative example, a graphics system may have a high performance mode requiring a 600 to 700 MHz memory clock rate. Such a memory clock rate corresponds to a GDDR3 clock rate and requires the terminated mode. However, a lower performance power savings mode, such as one with a memory clock rate of about 200-350 MHz, may be capable of operating in the un-terminated mode in which signal quality is degraded compared with the terminated mode if the switching threshold is appropriate adjusted. It will be understood that a 200-350 MHz memory clock rate for a lower performance power savings mode is merely exemplary. Investigations by the inventors indicate that in some applications the un-terminated mode may support memory clock rates in the range of 400-500 MHz.

Embodiments of the present invention may be implemented in a manner compatible with GDDR3 or GDDR4 memories. Conventional GDDR3 memory chips include a capability to disable on-die termination based on registers programmed in a mode register set, such as an Extended Mode Register Set (EMRS), using MRS and EMRS commands. However, conventionally on-die termination is used in GDDR3 for testing and debugging purposes. In contrast, in one embodiment of the present invention the GPU writes input commands to a Mode Register Set to change the termination mode to save power when a reduced memory clock rate is selected. Additionally, conventionally. GDDR3 memories utilize a single switching threshold. In contrast, in accordance with the present invention the switching threshold is also dynamically selected to permit the un-terminated mode to be used. As an illustrative example, for GDDR3 type data rates in the terminated mode, a switching threshold of 70% of a voltage VDDQ is typically required to support GDDR3 type memory clock rates (e.g., 600-700 MHz memory clock rates). In contrast, studies by the inventors indicate that in the un-terminated mode a 50% switching threshold is required to support memory clock rates at lower rates at rates of 100-300 MHz. As previously described, the un-terminated mode permits additional power savings to be achieved due to a reduction in DC leakage current. The switching thresholds of 70% and 50% for the terminated and un-terminated modes are exemplary percentages which may vary in a particular application within typical engineering tolerances, such as within a few percent.

Figure 2:
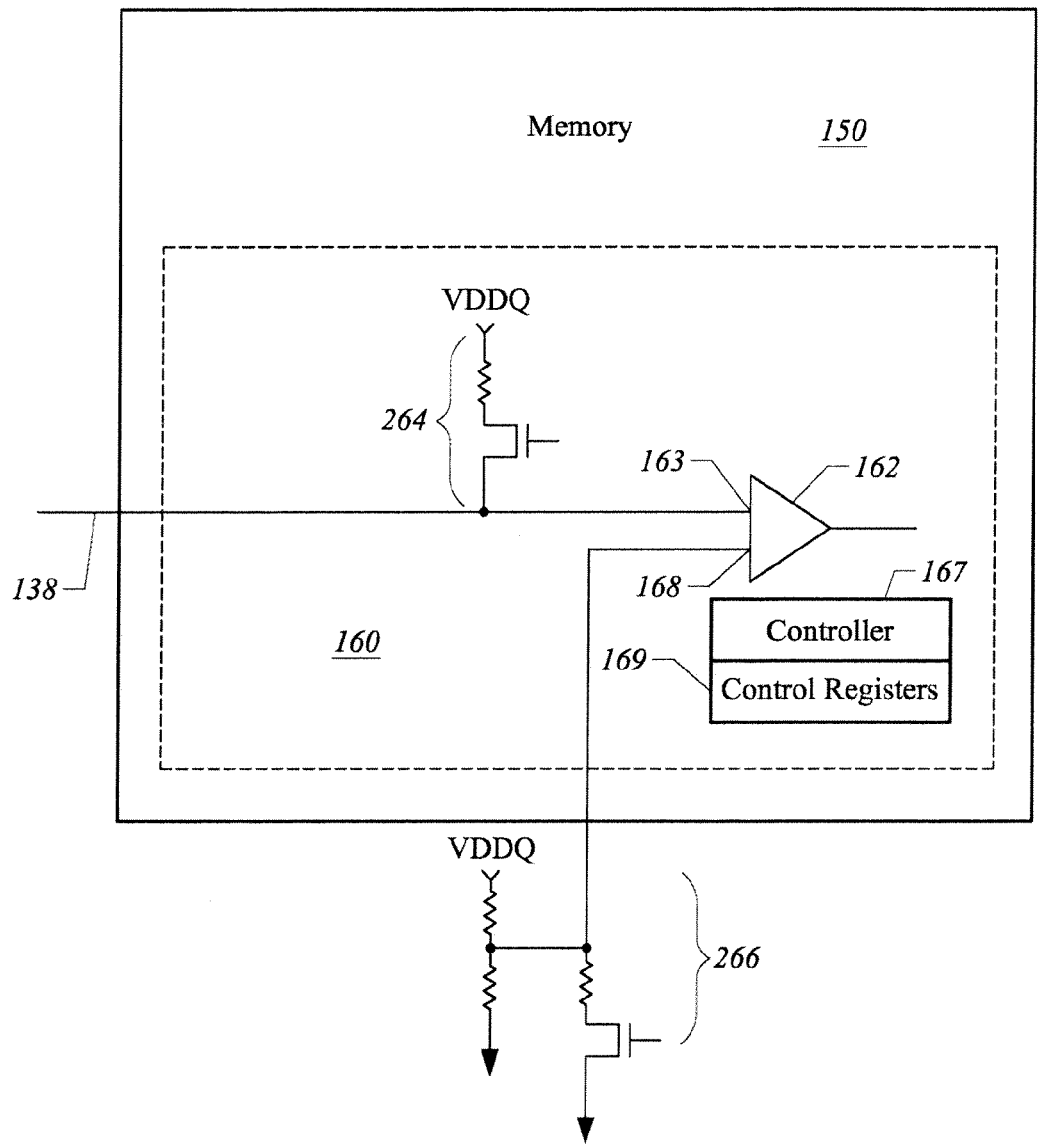
FIG. 2 illustrates a memory having dynamic termination between terminated and un-terminated modes in accordance with one embodiment of the present invention.

FIG. 2 illustrates an embodiment of memory 150 in which a termination selection circuit 264 and voltage switching selection circuit 266 are implemented using resistors and field effect transistors. Some components of FIG. 1 are omitted for purposes of illustration. In this embodiment, termination selection circuit 264 is modeled as having a single resistor in series with a transistor. In the terminated mode the transistor is switched on and data input node 163 is terminated by a pull-up resistor. In the un-terminated mode, the transistor is switched off and the data input node 163 is un-terminated. Voltage switching selection circuit 266 is modeled as a voltage divider circuit in which a transistor switch can be turned on or off to change the factor by which the input voltage is scaled. The resistance values may, for example, be selected to permit the voltage at voltage reference node 168 to generate two different switching thresholds such as 70% of VDDQ or 50% of VDDQ.

Figure 3:
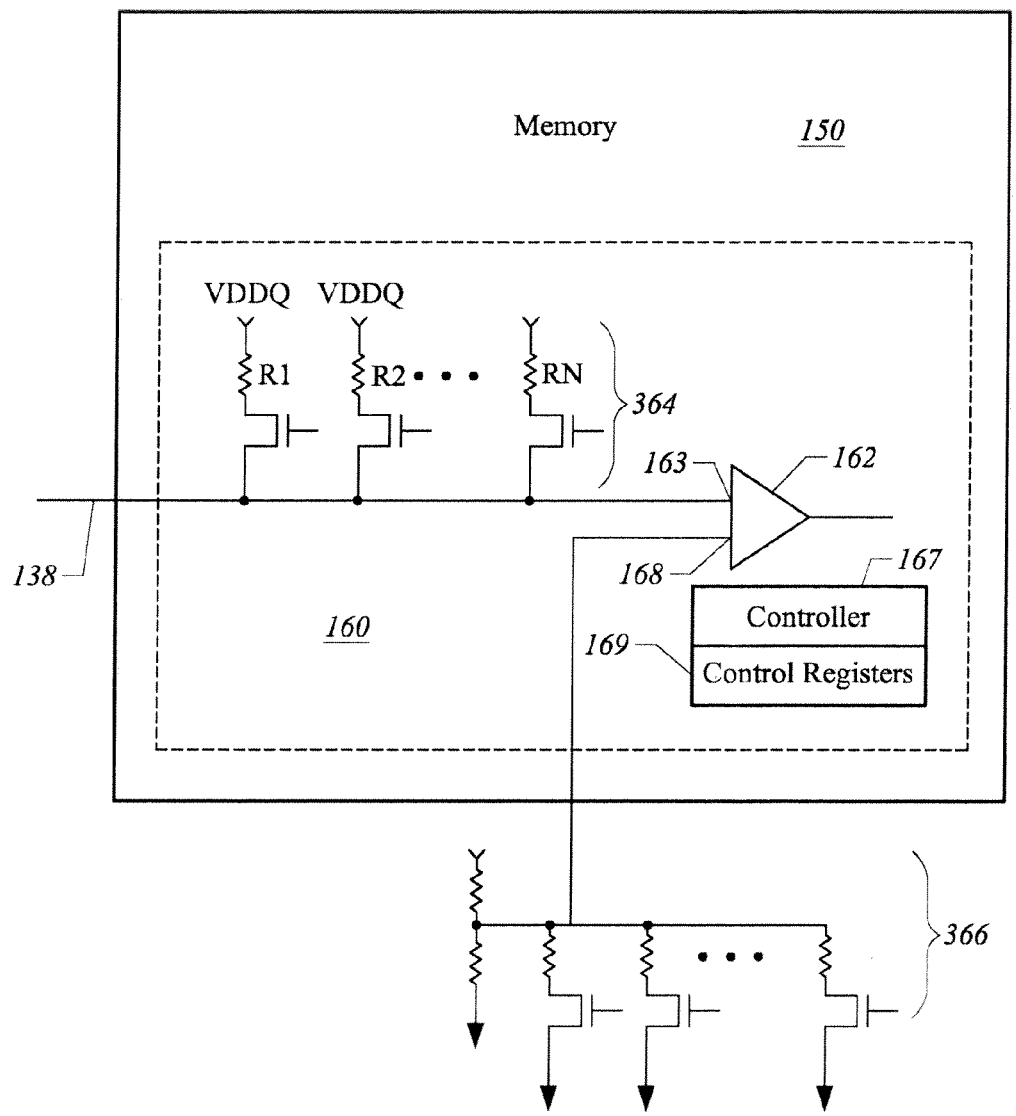
FIG. 3 illustrates a memory having two or more terminated modes in accordance with one embodiment of the present invention.

FIG. 3 illustrates an embodiment of memory 150 in which a termination selection circuit 364 has two or more different termination modes in addition to an un-terminated mode. For example, termination selection circuit 364 may have a sequence of resistors coupled to data input node 163 by respective transistors. Such an implementation may be useful, for example, to switch between a strongly terminated mode to a weakly terminated mode to provide greater flexibility in selecting tradeoffs between termination and DC leakage current. Voltage switching level selection circuit 366 may be implemented as a voltage divider in which the switching threshold is selected by choosing which transistors are switched on or off.

The sequence with which graphics system 100 switches the termination impedance and switching threshold is an important consideration. In particular, the termination impedance and switching threshold must be at values compatible with receiving valid data and commands at the current memory clock rate. Moreover, the memory must be in a stable state to reliably handle a memory access. Consequently, memory accesses are preferably prevented during the time interval required to switch the termination and switching threshold. The proper sequence of steps will also depend upon whether the starting point is the terminated mode (which has the highest signal quality and is therefore capable of supporting the highest memory clock rate) or the un-terminated mode (which has the poorest signal quality and is incapable of supporting the highest memory clock rate).

In one implementation, the sequence for switching from a terminated mode (with the highest signal quality) to the un-terminated mode (with the lowest signal quality) is as follows. First, GPU 120 begins at a high clock rate and reduces the memory clock rate. The GPU 120 also adjusts any necessary timing parameters of the memory using conventional commands. While the memory bus is still in the terminated mode with the 70% switching threshold, the GPU sends commands to the memory to disable the termination (e.g., EMRS or EMRS2 commands). Memory accesses are temporarily stopped for a pre-selected time period to permit the memory sufficient time to change the switching threshold. The GPU changes the switching threshold (e.g., from 70% to 50%) and then memory accesses are resumed.

In one implementation, the sequence for switching from the un-terminated mode (with a reduced memory clock rate) to the terminated mode (with a high memory clock rate) is as follows. First the GPU sends a command to the memory to enable the terminated mode (e.g., an EMRS or EMRS2 command) while the bus is still in the un-terminated mode with the 50% switching threshold. All DRAM accesses are stopped for a time interval sufficient to allow the memory to change the switching threshold. The GPU changes the switching threshold (e.g., from 50% to 70%). Memory accesses are then resumed and the clock frequency increased and any necessary timing parameter changes made.

While the present invention has been described with regards to a GDDR3 example, it will be understood that embodiments of the present invention can be applied to other memory designs having on-die termination. As one example, it is contemplated that the present invention can be implemented in GDDR4 memory architectures.

The previously described examples related to writes on the memory side of the graphics system. However, it will also be understood that embodiments of the present invention are contemplated for reads terminated on the GPU side of the graphics system in which the interface of the GPU to memory includes a selectable termination impedance and selectable reference voltage.

Figure 4:
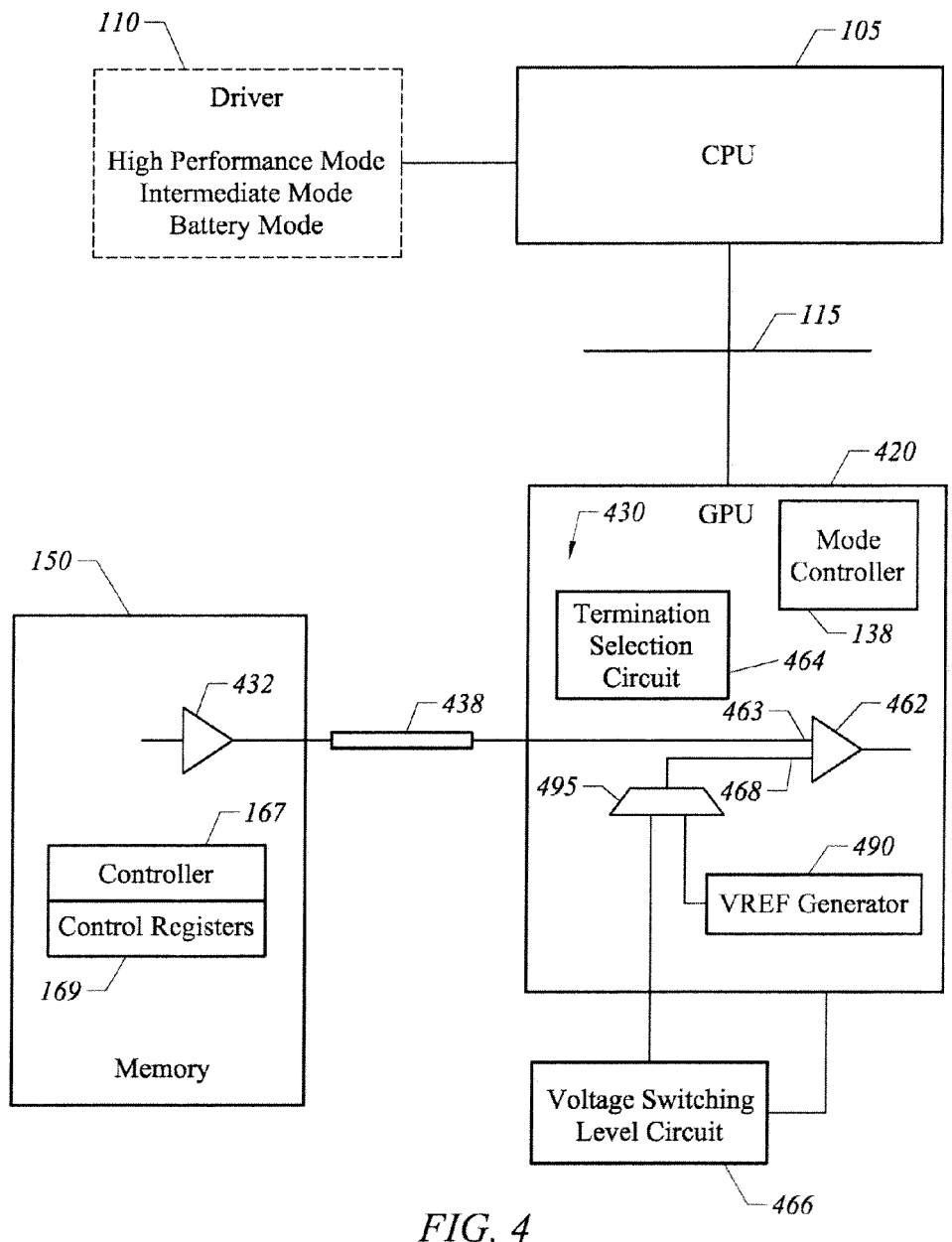
FIG. 4 illustrates a graphics processing unit having dynamic termination between terminated and un-terminated modes in accordance with one embodiment of the present invention.

FIG. 4 illustrates a data read mode of an exemplary graphics system in which the GPU 420 is receiving data from memory 150. In a data read mode, a driver 432 in memory 150 is coupled to an interface 430 of GPU 420 via transmission line 438 to data input node 463. In the example of FIG. 4, GPU 420 has on-die termination of driver 462 within GPU 420 via a termination selection circuit 464. In one embodiment a selector 495 permits the reference voltage of voltage reference node 468 to be set by an internal voltage reference generator 490 (e.g., a programmable reference voltage generator) or by an external voltage switching level circuit 466, depending on implementation. Termination selection circuit 464 may utilize any of the previously described termination selection circuits 164, 264, or 364 while voltage switching level circuit 466 may utilize any of the previously described voltage switching level circuits 166, 266 or 366. The reference voltage for different memory clock rates may be determined for different modes of operation of the graphics system using any of the previously described techniques and previously described exemplary reference switching voltages.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A graphics system with adjustable on-die memory termination, comprising:
 a memory, comprising:
  an on-die driver receiving a signal from a transmission line at a data input of a memory interface, the on-die driver having an input to adjust a switching threshold of said on-die driver;
  an on-die termination selection circuit to control a termination impedance at said data input, the termination selection circuit having at least two different selectable termination impedance values; and
  an on-die controller to dynamically select the termination impedance of said driver in response to an input command; and
 a mode controller of said graphics system selecting the termination impedance and switching threshold of said driver selected based on a memory clock rate of an operating mode of said system.

2. The graphics system of claim 1, wherein a first mode is a high performance mode with a first memory clock rate and a second mode is a power savings mode with a reduced memory clock rate to save power, the termination impedance selected in the second mode to reduce a DC leakage current and the switching threshold adjusted in the second mode to account for the change in termination impedance.

3. The graphics system of claim 2, further comprising a voltage switching level selection circuit regulating said switching threshold in response to commands from said mode controller.

4. The graphics system of claim 2, wherein said driver is terminated for a first mode and un-terminated for a second mode with said first mode having a first switching threshold and said second mode having a second switching threshold.

5. The graphics system of claim 4, wherein said first mode has said data input terminated to a pull-up voltage VDDQ with first switching threshold of about 70% of VDDQ and said second mode is un-terminated with a switching threshold of about 50% of VDDQ.

6. The graphics system of claim 4, wherein said mode controller is part of a graphics processing unit and said on-die controller reads a register into which an input command is written by said mode controller.

7. The graphics system of claim 6, wherein said register is part of a Mode Register Set.

8. The graphics system of claim 7, wherein said Graphics Double Data specification corresponds to one member selected from the group consisting of GDDR3 and GDDR4.

9. The graphics system of claim 4, wherein said graphics system includes a graphics processing unit and a voltage switching level circuit, said graphics processing unit generating an input command to select the termination impedance and said graphics processing unit controlling said voltage switching level circuit to adjust the switching threshold.

10. The graphics system of claim 9, wherein said graphics processing unit writes said input command into a register of said memory.

11. The graphics system of claim 10, wherein said graphics processing unit selects a first switching threshold for a first mode in which said driver is terminated and a second switching threshold for a second mode in which said driver is un-terminated.

12. The graphics system of claim 11, wherein the first mode has said data input terminated to a pull-up voltage VDDQ with the first switching threshold being about 70% of VDDQ and the second mode has said data input un-terminated with the second switching threshold being about 50% of VDDQ.

13. A graphics system having different power consumption modes, comprising:
 a graphics processing unit having a memory clock with at least two different selectable memory clock rates;
 a graphics memory coupled to said graphics processing unit, the graphics memory including a driver receiving a transmission line of a memory bus at a data input, the memory including a termination selection circuit to control a termination impedance at said data input and including an input to adjust a switching threshold of said driver;
 a voltage switching level circuit to control the switching threshold of said driver, the voltage switching level circuit having at least two different reference voltages selectable by said graphics processing unit;
 the system configured to have a first mode of operation having a high memory clock rate and a second mode of operation that is a power savings mode having a lower memory clock rate. the graphics processing unit configured to operate the driver terminated in the first mode of operation and un-terminated in the second mode of operation to reduce a DC leakage current, the system selecting different switching thresholds for the first mode and the second mode.

14. The graphics system of claim 13, wherein said first mode has said data input terminated to a pull-up voltage VDDQ with first voltage switching threshold of about 70% and said second mode has said data input un-terminated with a voltage switching threshold of about 50%.

15. The graphics system of claim 13, wherein said graphics processing unit writes an input command into a register of said graphic memory to select the termination impedance.

16. The graphics system of claim 15, wherein memory accesses are temporarily suspended by said graphics processing unit during a termination adjustment period following issuance of an input command to said memory.

17. The graphics system of claim 16, wherein the switching threshold is adjusted according to a sequence selected to maintain signal validity during transitions in memory clock rate.

18. A graphics system with adjustable on-die memory interface termination, comprising:
 a graphics processing unit, comprising:
  an on-die driver receiving a signal from a transmission line at a data input of an interface to a memory, the on-die driver having an input to adjust a switching threshold of said on-die driver;
  an on-die termination selection circuit to control a termination impedance at said data input, the termination selection circuit having at least two different selectable termination impedance values; and
  a mode controller of said graphics system selecting the termination impedance and switching threshold of said driver selected based on a memory clock rate of an operating mode of said system.

19. The graphics system of claim 18, wherein said a first mode has the on-die driver terminated and a second mode has the on-die driver un-terminated.

20. The graphics system of claim 19, wherein the first mode is a high performance mode having a higher memory clock rate than said second mode.

* * * * *